US010446596B2

United States Patent
Tonegawa

(10) Patent No.: US 10,446,596 B2
(45) Date of Patent: Oct. 15, 2019

(54) SEMICONDUCTOR DEVICE AND PRODUCTION METHOD

(71) Applicant: SONY CORPORATION, Tokyo (JP)

(72) Inventor: Susumu Tonegawa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/773,707

(22) PCT Filed: Nov. 11, 2016

(86) PCT No.: PCT/JP2016/083465
§ 371 (c)(1),
(2) Date: May 4, 2018

(87) PCT Pub. No.: WO2017/090455
PCT Pub. Date: Jun. 1, 2017

(65) Prior Publication Data
US 2018/0374883 A1    Dec. 27, 2018

(30) Foreign Application Priority Data

Nov. 25, 2015 (JP) .................................. 2015-229613

(51) Int. Cl.
*H01L 27/00* (2006.01)
*H01L 27/146* (2006.01)
(Continued)

(52) U.S. Cl.
CPC ...... *H01L 27/14616* (2013.01); *H01L 21/266* (2013.01); *H01L 21/26513* (2013.01);
(Continued)

(58) Field of Classification Search
CPC ......... H01L 27/14616; H01L 27/14643; H01L 27/14689; H01L 27/115; H01L 27/0207;
(Continued)

(56) References Cited

U.S. PATENT DOCUMENTS 5,705,410 A    1/1998 Guegan
6,306,709 B1   10/2001 Miyagi et al.
(Continued)

FOREIGN PATENT DOCUMENTS

CN    1140336 A    1/1997
CN    104716095 A   6/2015
(Continued)

OTHER PUBLICATIONS

International Search Report and Written Opinion of PCT Application No. PCT/JP2016/083465, dated Jan. 31, 2017, 12 pages Of ISRWO.

*Primary Examiner* — Nikolay K Yushin
(74) *Attorney, Agent, or Firm* — Chip Law Group

(57) ABSTRACT

The present technology relates to a semiconductor device and a production method that enable noise reduction. A drain region and a source region provided in a predetermined region of a semiconductor substrate; a channel region provided between the drain region and the source region; and a gate electrode formed on the channel region are included. The channel region includes a first impurity diffusion region, and a second impurity diffusion region that is an impurity diffusion region of a same conductivity type as the first impurity diffusion region, and has an impurity concentration different from an impurity concentration of the first impurity diffusion region, and is formed at a substantially center part of the first impurity diffusion region. The present technology can be applied to a transistor that configures an imaging device, for example.

15 Claims, 17 Drawing Sheets

(51) Int. Cl.
*H01L 21/822* (2006.01)
*H01L 21/8234* (2006.01)
*H01L 29/78* (2006.01)
*H01L 27/04* (2006.01)
*H01L 27/06* (2006.01)
*H01L 27/08* (2006.01)
*H01L 27/088* (2006.01)
*H01L 21/265* (2006.01)
*H01L 21/266* (2006.01)
*H01L 21/00* (2006.01)

(52) U.S. Cl.
CPC ........ *H01L 21/822* (2013.01); *H01L 21/8234* (2013.01); *H01L 27/04* (2013.01); *H01L 27/06* (2013.01); *H01L 27/08* (2013.01); *H01L 27/088* (2013.01); *H01L 27/146* (2013.01); *H01L 27/14643* (2013.01); *H01L 27/14689* (2013.01); *H01L 29/78* (2013.01)

(58) Field of Classification Search
CPC . H01L 27/108; H01L 27/088; H01L 27/2436; H01L 21/266; H01L 21/26513; H01L 21/823807; H01L 21/823418
See application file for complete search history.

(56) References Cited

U.S. PATENT DOCUMENTS

| | | | | |
|---|---|---|---|---|
| 7,199,000 B2* | 4/2007 | Fukuda | ................... | H01L 21/84 |
| | | | | 257/E21.703 |
| 7,315,060 B2* | 1/2008 | Iwata | ................. | G11C 16/0475 |
| | | | | 257/324 |
| 8,580,662 B2* | 11/2013 | Shimizu | ............ | H01L 27/11521 |
| | | | | 257/E21.179 |
| 2005/0130355 A1* | 6/2005 | Fukuda | ................... | H01L 21/84 |
| | | | | 438/152 |
| 2005/0280065 A1* | 12/2005 | Iwata | ................. | G11C 16/0475 |
| | | | | 257/310 |
| 2012/0028424 A1* | 2/2012 | Shimizu | ................ | H01L 27/115 |
| | | | | 438/257 |
| 2015/0171168 A1 | 6/2015 | Ishida et al. | | |

FOREIGN PATENT DOCUMENTS

| | | |
|---|---|---|
| EP | 0750339 A1 | 12/1996 |
| FR | 2735904 A | 12/1996 |
| JP | 08-274330 A | 10/1996 |
| JP | 09-008305 A | 1/1997 |
| JP | 11-274486 A | 10/1999 |
| JP | 2015-118973 A | 6/2015 |

* cited by examiner

A-A

B-B

——— GRAPH 1 = CONCENTRATION DIFFERENCE = 1 TIME
------ GRAPH 2 = CONCENTRATION DIFFERENCE = 1.25 TIMES
—·— GRAPH 3 = CONCENTRATION DIFFERENCE = 1.30 TIMES
—··— GRAPH 4 = CONCENTRATION DIFFERENCE = 1.63 TIMES
— — — GRAPH 5 = CONCENTRATION DIFFERENCE = 2.2 TIMES
·········· GRAPH 6 = CONCENTRATION DIFFERENCE = 2.8 TIMES

SEMICONDUCTOR DEVICE AND PRODUCTION METHOD

CROSS REFERENCE TO RELATED APPLICATIONS

This application is a U.S. National Phase of International Patent Application No. PCT/JP2016/083465 filed on Nov. 11, 2016, which claims priority benefit of Japanese Patent Application No. JP 2015-229613 filed in the Japan Patent Office on Nov. 25, 2015. Each of the above-referenced applications is hereby incorporated herein by reference in its entirety.

TECHNICAL FIELD

The present technology relates to a semiconductor device and a production method. Its detail relates to a semiconductor device and a production method that can prevent generation of noise.

BACKGROUND ART

In the past, a general MOS transistor formed in a semiconductor device or an imaging device is a surface channel type in which a region under a gate electrode is formed of an impurity region of an opposite conductivity type to a source-drain region. In the surface channel MOS transistor, a channel formed of an inversion layer is formed on a semiconductor substrate surface by applying voltage to the gate electrode, in order to flow electric current between a source and a drain.

Such a general MOS transistor formed in a semiconductor device or an imaging device, particularly the surface channel MOS transistor in which a channel region is formed on a surface side of the semiconductor substrate, has a possibility that mobility and noise characteristics degrade due to a carrier trap that exists in the vicinity of an interface between the semiconductor substrate and a gate insulating film.

A buried-channel MOS transistor including a channel region formed at a position away from the surface of the semiconductor substrate is not influenced by the carrier trap that exists in the vicinity of the interface between the semiconductor substrate and the gate insulating film. However, an impurity whose ion is implanted in the channel region causes decrease of an impurity concentration due to segregation, pileup, diffusion, and the like of the impurity on an element separating region side of the channel region, because of influence of a heat process. Thereby, there is a possibility that the noise characteristics degrade due to reduction in the effective gate width.

Patent Literature 1 proposes a buried-channel MOS transistor in which a channel region is configured with a first impurity diffusion region formed by ion implantation from an oblique direction and a second impurity diffusion region formed on an entire surface of a region under a gate electrode, in a region contacting with an element separating region side. In the proposal, the formation of the first impurity diffusion region compensates for decrease of the impurity concentration which occurs on the element separating region side of the channel region, enabling elongation of the effective gate width, and achieving reduction of the noise.

CITATION LIST

Patent Literature

Patent Literature 1: JP 2013-045879A

DISCLOSURE OF INVENTION

Technical Problem

A transistor provided in the imaging device, for example an amplification transistor, is configured such that boron ions are implanted in the element separating region, to reduce dark current generated from the element separating region side of the channel region. It is possible that the boron whose ion is implanted at the time of production reaches the channel region due to a subsequent heat process or the like, and the boron concentration of the channel end portion becomes larger than that of the channel center portion. Hence, it is possible that the effective gate width is narrowed, and the noise characteristics degrade.

In the case of the structure proposed in Patent Literature 1, the ion implantation condition for compensating for the decrease of the impurity concentration that occurs on the element separating region side of the channel region makes the current density on the element separating region side of the channel region not high. The interface level deteriorates on the element separating region side of the channel region due to the influence of dry etching or the like for forming the element separating region, and it is possible that the noise characteristics degrade due to the interface level when the current density of the element separating region side of the channel region becomes high.

The present technology is made in view of the above situation, in order to reduce the degradation of the noise characteristics.

Solution to Problem

A first semiconductor device according to an aspect of the present technology includes: a drain region and a source region provided in a predetermined region of a semiconductor substrate; a channel region provided between the drain region and the source region; and a gate electrode formed on the channel region. The channel region includes a first impurity diffusion region, and a second impurity diffusion region that is an impurity diffusion region of a same conductivity type as the first impurity diffusion region, and has an impurity concentration different from an impurity concentration of the first impurity diffusion region, and is formed at a substantially center part of the first impurity diffusion region.

The impurity concentration of the second impurity diffusion region can be higher than the impurity concentration of the first impurity diffusion region.

The impurity concentration of the second impurity diffusion region can be 1.25 times or more the impurity concentration of the first impurity diffusion region, with reference to the impurity concentration of the first impurity diffusion region.

The impurity concentration of the second impurity diffusion region can be smaller than 2.8 times the impurity concentration of the first impurity diffusion region, with reference to the impurity concentration of the first impurity diffusion region.

The second impurity diffusion region can be formed in a strip shape in a gate length direction of a center part of the first impurity diffusion region.

The second impurity diffusion region can be formed in a scattered manner in a predetermined shape in a gate length direction or a gate width direction of a center part of the first impurity diffusion region.

The second impurity diffusion region can be formed in a predetermined shape at a center part of the first impurity diffusion region.

A second semiconductor device according to an aspect of the present technology includes: a drain region and a source region provided in a predetermined region of a semiconductor substrate; a channel region provided between the drain region and the source region; and a gate electrode formed on the channel region. The channel region is an impurity diffusion region. The impurity is doped in such a manner that an impurity concentration is highest at a substantially center part in the channel region.

A production method according to an aspect of the present technology produces a semiconductor device, the semiconductor device including: a drain region and a source region provided in a predetermined region of a semiconductor substrate; a channel region provided between the drain region and the source region; and a gate electrode formed on the channel region. The channel region includes a first impurity diffusion region, and a second impurity diffusion region that is an impurity diffusion region of a same conductivity type as the first impurity diffusion region, and is formed at a substantially center part of the first impurity diffusion region.

The first impurity diffusion region can be formed by forming a mask opened in the channel region and doping an impurity. The second impurity diffusion region can be formed by forming a mask opened in a strip shape in a gate length direction of the channel region and doping an impurity.

The first impurity diffusion region can be formed by forming a mask opened in the channel region and doping an impurity. The second impurity diffusion region can be formed by forming a mask including a predetermined shape opened in a scattered manner in a gate length direction or a gate width direction of the channel region and doping an impurity.

The first impurity diffusion region can be formed by forming a mask opened in the channel region and doping an impurity. The second impurity diffusion region can be formed by forming a mask including a predetermined shape opened at a center part of the channel region and doping an impurity.

The first impurity diffusion region and the second impurity diffusion region can be formed by forming a mask opened in the channel region and doping an impurity from an oblique direction.

The impurity can be doped in such a manner that an impurity concentration of the second impurity diffusion region is 1.25 times or more an impurity concentration of the first impurity diffusion region, with reference to the impurity concentration of the first impurity diffusion region.

The impurity can be doped in such a manner that an impurity concentration of the second impurity diffusion region is smaller than 2.8 times an impurity concentration of the first impurity diffusion region, with reference to the impurity concentration of the first impurity diffusion region.

In the first semiconductor device according to an aspect of the present technology, a drain region and a source region provided in a predetermined region of a semiconductor substrate; a channel region provided between the drain region and the source region; and a gate electrode formed on the channel region are included. The channel region includes a first impurity diffusion region, and a second impurity diffusion region that is an impurity diffusion region of a same conductivity type as the first impurity diffusion region, and has an impurity concentration different from an impurity concentration of the first impurity diffusion region, and is formed at a substantially center part of the first impurity diffusion region.

In the second semiconductor device according to an aspect of the present technology, a drain region and a source region provided in a predetermined region of a semiconductor substrate; a channel region provided between the drain region and the source region; and a gate electrode formed on the channel region are included. The channel region is an impurity diffusion region. The impurity is doped in such a manner that an impurity concentration is highest at a substantially center part in the channel region.

In a production method of one aspect of the present technology, a first semiconductor device or a second semiconductor device is produced.

Advantageous Effects of Invention

In one aspect of the present technology, the degradation of the noise characteristics can be prevented.

Note that the effect described herein is not necessarily restrictive, but may be one of the effects described in the present disclosure.

MODE(S) FOR CARRYING OUT THE INVENTION

In the following, a mode for carrying out the present technology (hereinafter, referred to as embodiment) will be described. Note that the description is made in the following order.
1. Configuration of Imaging Device
2. Configuration of Amplification Transistor
3. Configuration of Amplification Transistor That Employs Present Technology
4. Formation Example of Second Impurity Region
5. Regarding Production Method
6. Application Example to Electronic Device
7. Usage Example <Configuration of Imaging Device>

Figure 1:
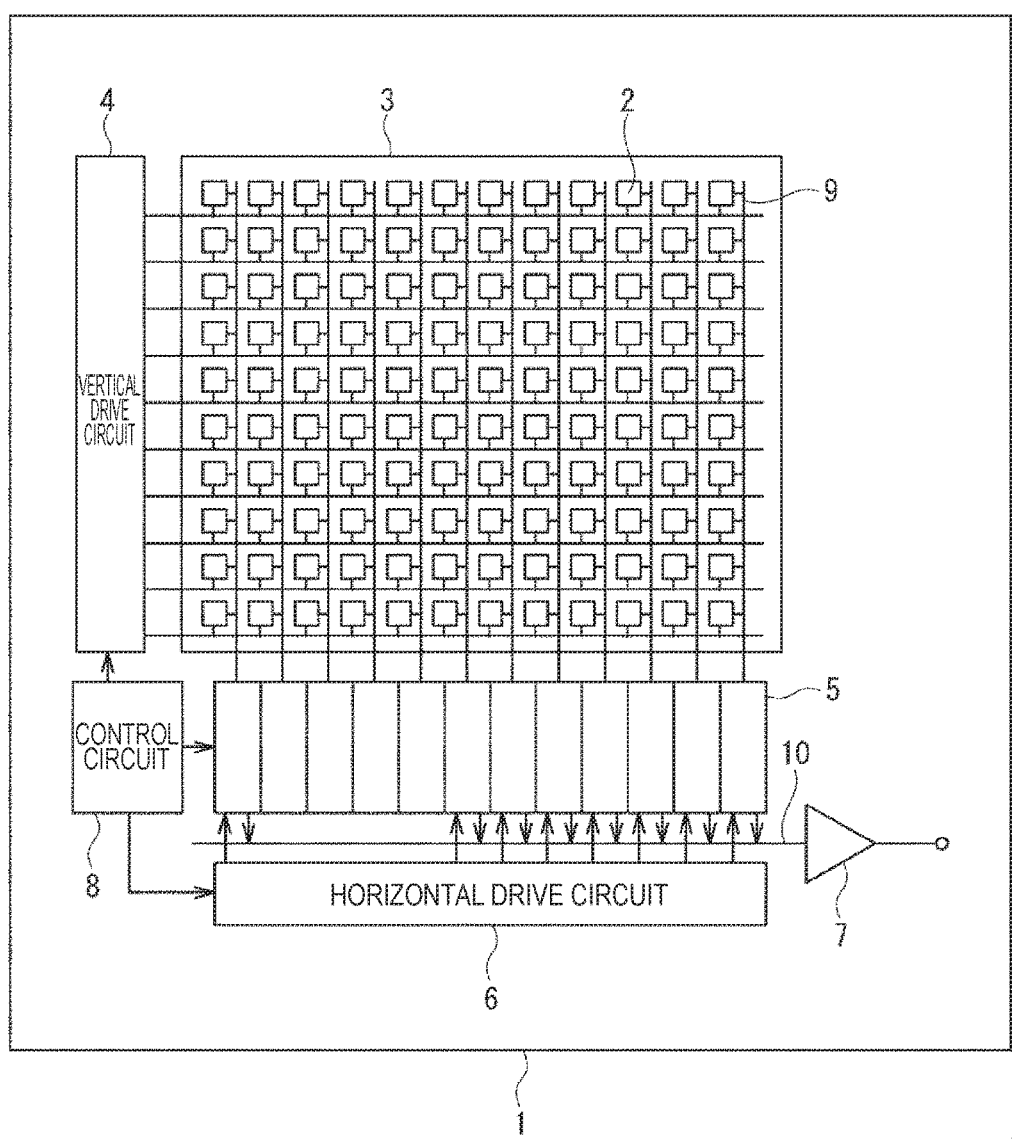
FIG. 1 is a diagram illustrating a configuration of one embodiment of an imaging device that employs the present technology.

FIG. 1 is a diagram illustrating a configuration of one embodiment of an imaging device that employs the present technology. The imaging device 1 in the present embodiment includes a pixel region 3 composed of a plurality of pixels 2 arrayed on a substrate made of silicon, a vertical drive circuit 4, column signal processing circuits 5, a horizontal drive circuit 6, an output circuit 7, a control circuit 8, etc.

The pixel 2 is configured with a photoelectric conversion unit including a photo diode and a plurality of pixel transistors, and a plurality of pixels 2 are arranged regularly in a two-dimensional array on the substrate. The pixel transistors that configures the pixel 2 may be four MOS transistors including a transfer transistor, a reset transistor, a selection transistor, and an amplifier transistor, and may be three transistors excluding the selection transistor. The present embodiment employs an example of the four pixel transistors including the selection transistor.

The pixel region 3 is composed of the plurality of pixels 2 arranged regularly in the two-dimensional array. The pixel region 3 is composed of an effective pixel region that actually receives a light and amplifies a signal electric charge generated by photoelectric conversion and sends out the signal electric charge to the column signal processing circuits 5, and a black reference pixel region (not illustrated in a drawings) for outputting a reference optical black for black level. The black reference pixel region is usually formed in an outer periphery of the effective pixel region.

The control circuit 8 generates a control signal and a reference clock signal for operation of the vertical drive circuit 4, the column signal processing circuits 5, and the horizontal drive circuit 6, etc., on the basis of a perpendicular synchronization signal, a horizontal synchronization signal, and a master clock. Then, the clock signal, the control signal, etc. generated by the control circuit 8 are input into the vertical drive circuit 4, the column signal processing circuits 5, the horizontal drive circuit 6, etc.

The vertical drive circuit 4 is configured with a shift register for example, and selectively scans each pixel 2 of the pixel region 3 in the vertical direction sequentially row by row. Then, a pixel signal based on the signal electric charge generated according to the received light amount in the photo diode of each pixel 2 is supplied to the column signal processing circuits 5 through vertical signal lines.

For example, the column signal processing circuits 5 are provided for respective columns of the pixels 2, and perform signal processing, such as denoising and signal amplification, to the signals output from the pixels 2 of one row, pixel column by pixel column, on the basis of the signal from the black reference pixel region (although not illustrated in the drawings, formed around the effective pixel region). In the output stage of the column signal processing circuits 5, a horizontal selection switch (not illustrated in the drawings) is provided between the column signal processing circuits 5 and a horizontal signal line 10.

The horizontal drive circuit 6 is configured with a shift register for example, and sequentially selects each of the column signal processing circuits 5 by outputting a horizontal scan pulse sequentially, and causes a pixel signal to be output from each of the column signal processing circuits 5 to the horizontal signal line 10.

The output circuit 7 performs signal processing to the signal supplied sequentially through the horizontal signal line 10 from each of the column signal processing circuits 5, and outputs the signal.

Figure 2:
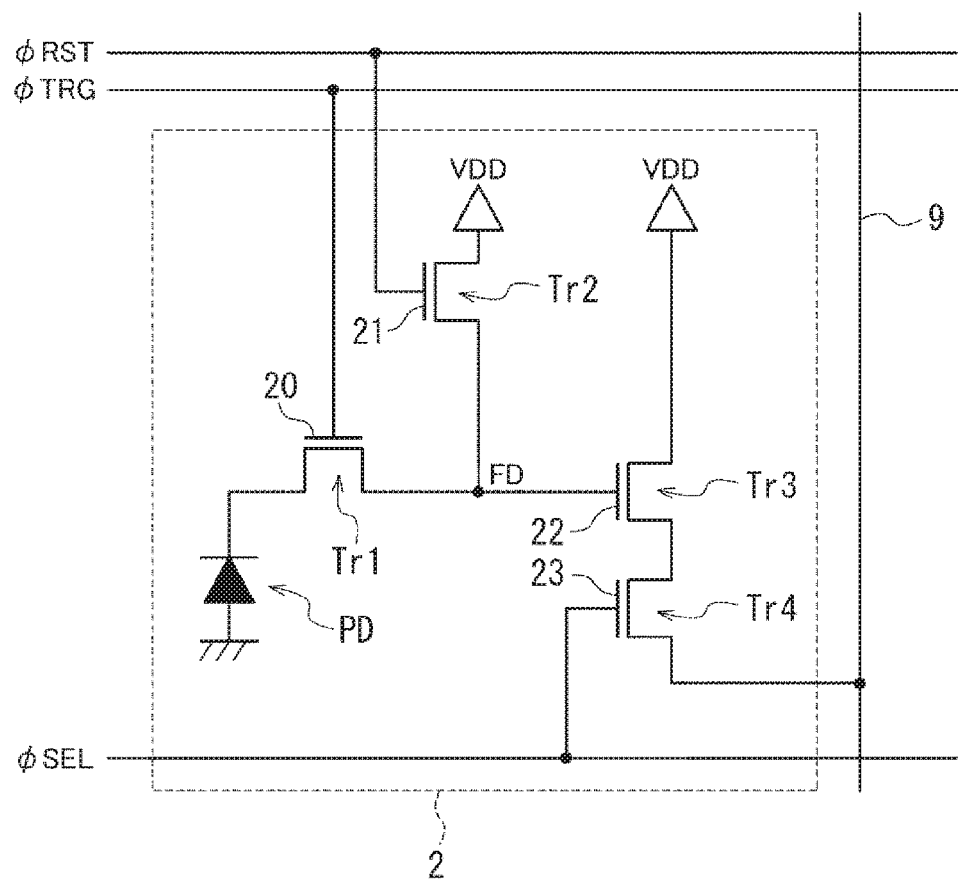
FIG. 2 is an equivalent circuit diagram of pixels that compose an imaging device.

FIG. 2 is an equivalent circuit diagram of a pixel that makes up the imaging device 1. The unit pixel 2 is configured with a photo diode PD which is a photoelectric conversion element, a transfer transistor Tr1, a reset transistor Tr2, an amplification transistor Tr3, and a selection transistor Tr4. These pixel transistors Tr1 to Tr4 are configured with n-channel MOS transistors, for example. Also, as described later, the amplification transistor Tr3 is a buried-channel MOS transistor.

The transfer transistor Tr1 is configured such that its source is connected to the cathode side of the photo diode PD, and the drain is connected to a floating diffusion section FD. Also, a transfer line for supplying a transfer pulse φTRG is connected to a gate electrode 20 between the source and drain of the transfer transistor Tr1. The signal electric charge (electron) photoelectrically converted by the photo diode PD and accumulated here is transferred to the floating diffusion section FD, by the transfer pulse φTRG applied to the gate electrode 20 of the transfer transistor Tr1.

The reset transistor Tr2 is configured such that its drain is connected to a power-supply voltage VDD, and the source is connected to the floating diffusion section FD. Also, a reset line for supplying a reset pulse φRST is connected to a gate electrode 21 between the source and drain of the reset transistor Tr2. The reset pulse φRST is applied to the gate electrode 21 of the reset transistor Tr2, before the signal electric charge is transferred to the floating diffusion section FD from the light receiving section PD. Thereby, the electric potential of the floating diffusion section FD is reset to a VDD level by the power-supply voltage VDD.

The amplification transistor Tr3 is configured such that its drain is connected to the power-supply voltage VDD, and the source is connected to the drain of the selection transistor Tr4. Moreover, the floating diffusion section FD is connected to a gate electrode 23 between the source and drain of the amplification transistor Tr3. This amplification transistor Tr3 makes up a force follower circuit for which the power-supply voltage VDD is set as a load, in order to output a pixel signal according to electric potential change of the floating diffusion section FD.

The selection transistor Tr4 is configured such that its drain is connected to the source of the amplification transistor Tr3, and the source is connected to a vertical signal line 9. Also, a selection line for supplying a selection pulse φSEL is connected to a gate electrode 23 between the source and drain of the selection transistor Tr4. The pixel signal amplified by the amplification transistor Tr3 is output to the vertical signal line 9, by the selection pulse φSEL supplied to the gate electrode 23 for each pixel.

In the imaging device 1 having the above configuration, the signal electric charge accumulated in the light receiving section PD is read out to the floating diffusion section FD by the transfer transistor Tr1, by supplying the transfer pulse φTRG to the gate electrode 20. The signal electric charge is read out, and thereby the electric potential of the floating diffusion section FD changes, and its electric potential change is transmitted to the gate electrode 22. Then, the electric potential supplied to the gate electrode 22 is amplified by the amplification transistor Tr3, and is selectively output to the vertical signal line 9 by the selection transistor Tr4 as the pixel signal.

Also, the signal electric charge read out to the floating diffusion section FD is reset to the same electric potential as the electric potential close to the power-supply voltage VDD by the reset transistor Tr2, by supplying the reset pulse φRST to the gate electrode 22. Then, the pixel signal output to the vertical signal line 9 is thereafter output via the column signal processing circuits 5, the horizontal signal line 10, and the output circuit 7 illustrated in FIG. 1.

Figure 3:
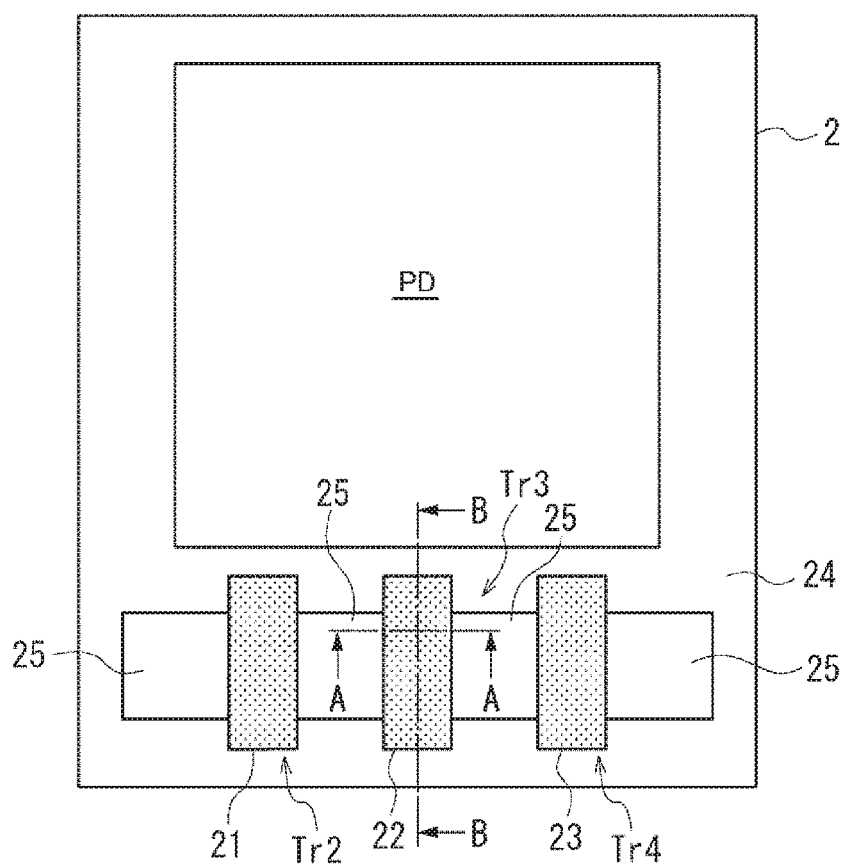
FIG. 3 is a diagram for describing locations of transistors of one pixel.

FIG. 3 is a plan layout diagram of a unit pixel. In FIG. 3, illustration of the transfer transistor Tr1 is omitted. As illustrated in FIG. 3, in each pixel 2, the photo diode PD is formed at the center portion of the unit pixel region, and the reset transistor Tr2, the amplification transistor Tr3, and the selection transistor Tr4 are located side by side in the horizontal direction, on one side of the region in which the photo diode PD is formed.

Then, an active region (active region) formed in the semiconductor substrate, which includes a source-drain region 25 of each pixel transistor Tr2 to Tr4 and regions under the gate electrodes 21 to 23 is separated electrically by an element separating region 24 formed with shallow trench isolation (STI). Also, each of the pixel transistors Tr1 to Tr4 can be configured with a buried-channel MOS transistor.

<Configuration of Amplification Transistor>

Figure 4A:
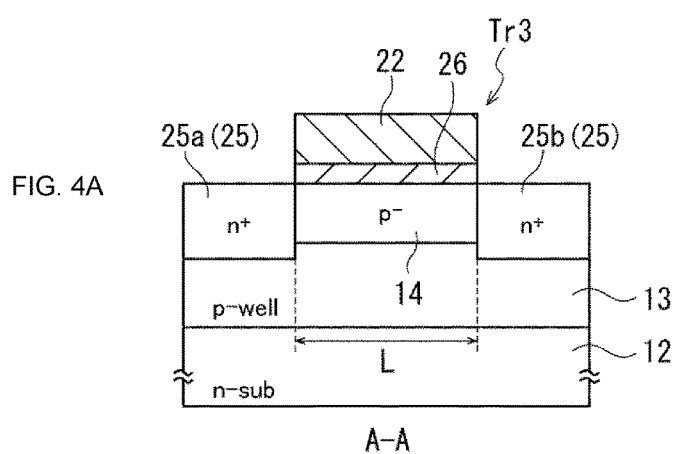
FIGS. 4A and 4B are diagrams for describing a configuration of an amplification transistor.

Next, a configuration of the amplification transistor Tr3 that configures the pixel 2 will be described. FIG. 4A illustrates a cross-sectional configuration along the A-A line of FIG. 3, and FIG. 4B illustrates a cross-sectional configuration along the B-B line of FIG. 3.

Note that the amplification transistor Tr3 that employs the present technology includes regions of different impurity concentrations in the channel region, as described later with reference to FIGS. 5, 6A, and 6B. In order to make clear the difference between such an amplification transistor Tr3 including the regions of different impurity concentrations in the channel region and the amplification transistor Tr3 not including the regions of different impurity concentrations in the channel region, the amplification transistor Tr3 not including the regions of different impurity concentrations in the channel region will be described first with reference to FIGS. 4A and 4B.

Figure 4B:
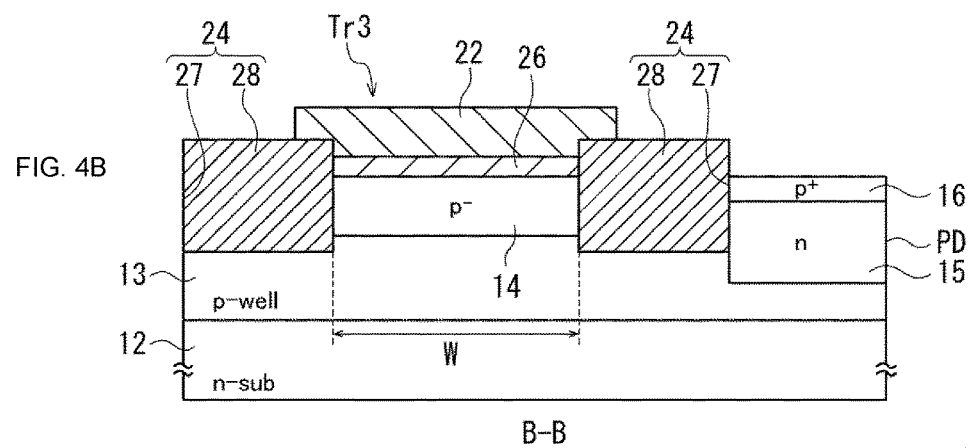

A second conductivity type, for example p-type, well region 13 of the element formation region is formed on a surface side of a first conductivity type, for example n-type, semiconductor substrate 12, as illustrated in FIG. 4A and FIG. 4B. In addition, the pixel transistor (not illustrated in the drawings) including the amplification transistor Tr3 and the photo diode PD are formed in the well region 13 of the element formation region.

The amplification transistor Tr3 includes a source region 25a and a drain region 25b formed on the surface side, and a gate electrode 22 formed between the source region 25a and the drain region 25b above the semiconductor substrate 12. The source region 25a and the drain region 25b are formed in the well region 13 formed on the surface side of the semiconductor substrate 12, and are configured with n-type impurity regions.

The gate electrode 22 is formed with a gate insulating film 26 made of silicon dioxide film for example in between, above the semiconductor substrate 12, and is formed of polysilicon for example. In addition, a channel region 14 of a p-type impurity region is formed on the semiconductor substrate 12 surface side below the gate electrode 22.

As illustrated in FIG. 4B, an active region including the channel region 14 is separated electrically by element separating regions 24 formed with what is called STI, which are configured with trench sections 27 formed in the semiconductor substrate 12 and buried films 28 buried in the trench sections 27. The trench sections 27 are formed with an intended depth from the surface of the semiconductor substrate 12. Also, the buried films 28 are configured with silicon dioxide films made of insulation material, for example.

Here, the gate width W of the amplification transistor Tr3 is set to a distance from one element separating region 24 to the other element separating region 24, as illustrated in FIG. 4B. Also, the gate length L is set to a distance from the source region 25a side end portion to the drain region 25b side end portion below the gate electrode 22, as illustrated in FIG. 4A.

In a general surface-channel MOS transistor Tr having such a configuration, in the case where intended voltage is supplied to the gate electrode 22, the potential in the vicinity of the interface between the gate insulating film 26 and the semiconductor substrate 12 is changed, to flow electrons. That is, in the surface channel MOS transistor, the electric charge in the channel region 14 is concentrated at the interface between the gate insulating film 26 and the semiconductor substrate 12.

However, a large number of carrier traps are formed in the vicinity of the interface between the gate insulating film 26 and the semiconductor substrate 12, and thus it is possible that the mobility and the noise characteristics degrade in the case where electric charge flows in the surface of the semiconductor substrate 12.

<Configuration of Amplification Transistor that Employs Present Technology>

Figure 5:
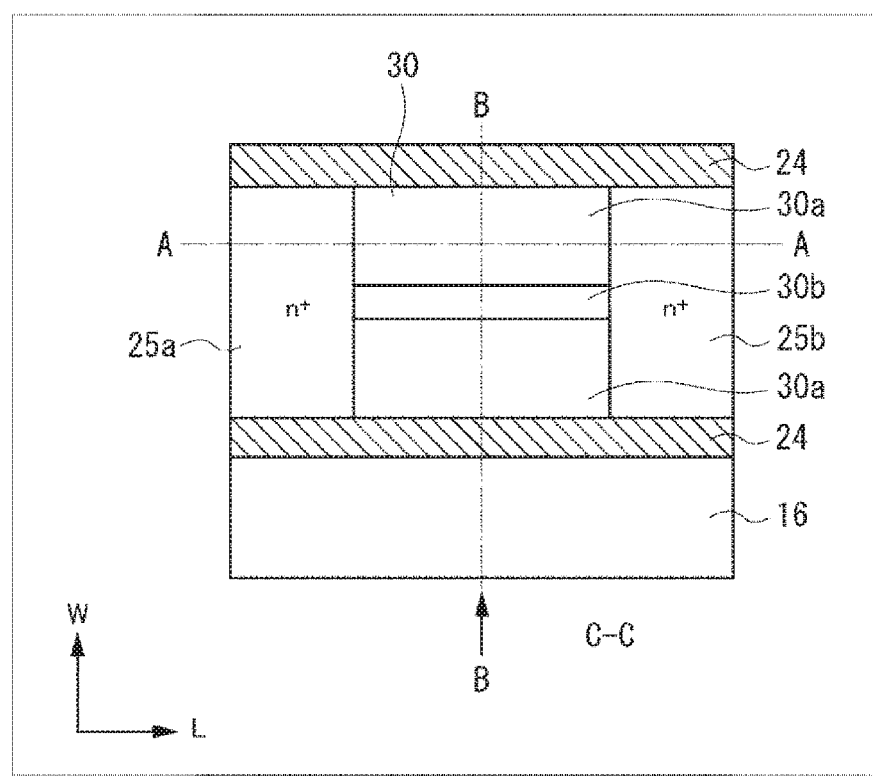
FIG. 5 is a diagram illustrating a configuration of an amplification transistor that employs the present technology.
Figure 6A:
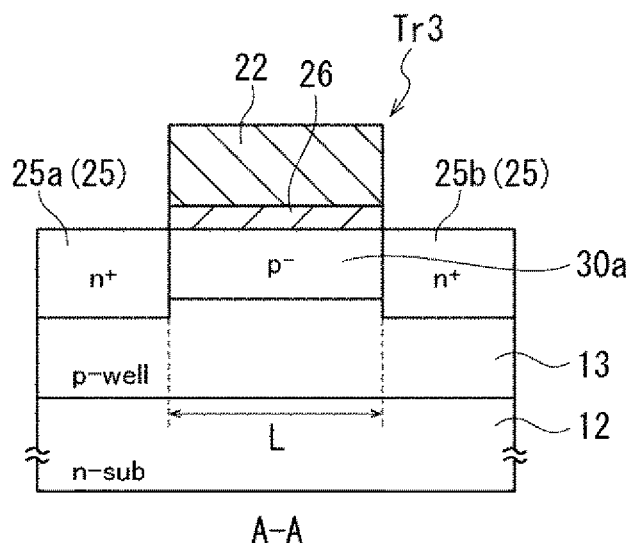
FIGS. 6A and 6B are diagrams illustrating a configuration of an amplification transistor that employs the present technology.
Figure 6B:
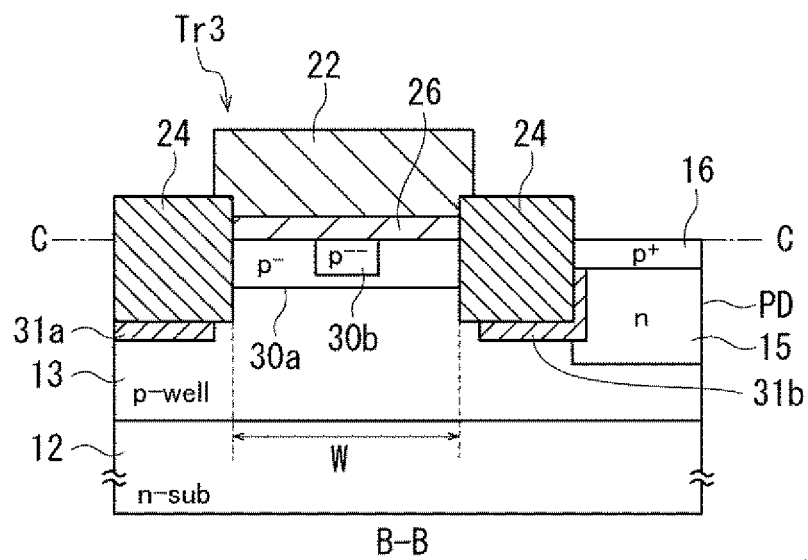

In the amplification transistor Tr3 that employs the present technology illustrated in FIGS. 5, 6A and 6B, the regions of different impurity concentrations are provided in the channel region 14 (channel region 30 in FIGS. 5, 6A and 6B), and thereby the effective gate width W can be elongated without changing the size of the gate electrode, and the influence of the interface level of the element separating region side is prevented, and noise reduction is achieved.

The amplification transistor Tr3 that employs the present technology that provides such an effect will be described additionally. FIGS. 5, 6A, and 6B are diagrams illustrating a configuration of the amplification transistor Tr3 that employs the present technology. FIG. 5 is a plan layout diagram of a unit pixel likewise FIG. 3, but is a diagram that illustrates a part of the amplification transistor Tr3 and illustrates a layer under the gate oxide film 26.

FIG. 6A illustrates a cross-sectional configuration along the A-A line of FIG. 3 likewise FIG. 4A, and FIG. 6B illustrates a cross-sectional configuration along the B-B line of FIG. 3 likewise FIG. 4B. In other words, FIG. 6A illustrates a cross-sectional configuration along the A-A line of FIG. 5, and FIG. 6B illustrates a cross-sectional configuration along the B-B line of FIG. 5. Also, FIG. 5 illustrates a cross-sectional configuration along the C-C line of FIG. 6B.

In the amplification transistor Tr3 illustrated in FIGS. 5, 6A, and 6B, the parts having the same configuration as the amplification transistor Tr3 illustrated in FIGS. 3, 4A, and 4B are denoted with the same reference signs, and description will be omitted as appropriate.

Referring to FIG. 5, a channel region 30 includes a first impurity diffusion region 30a and a second impurity diffusion region 30b. The second impurity diffusion region 30b is formed in a strip shape at the center part of the channel region 30.

In the cross-sectional configuration along the A-A line of FIG. 5 (the cross-sectional configuration in the gate length L direction of the amplification transistor Tr3), in other words, in the case where cut off at the position of the first impurity diffusion region 30a of the channel region 30, the channel region 30 is formed of the first impurity diffusion region 30a, as illustrated in FIG. 6A. Although not illustrated in the drawings, in the case where cut off at the position of the second impurity diffusion region 30b of the channel region 30, the part illustrated as the first impurity diffusion region 30a of FIG. 6A is replaced by the second impurity diffusion region 30b.

In the cross-sectional configuration along the B-B line of FIG. 5 (the cross-sectional configuration in the gate width W direction of the amplification transistor Tr3), the second impurity diffusion region 30b is formed at the center part of the channel region 30, and the first impurity diffusion region 30a is formed at both ends (so as to surround the second impurity diffusion region 30b), as illustrated in FIG. 6B. Also, as illustrated in FIG. 6B, an impurity diffusion region 31 including p-type impurity for reducing the dark current generated from the element separating region 24 side is formed near the element separating region 24.

This impurity diffusion region 31 including the p-type impurity for reducing the dark current can be formed by implanting boron ions in the element separating region 24. In such a production process, it is possible that the implanted boron ions proceed to the channel region 14 of the amplification transistor Tr3, by the subsequent heat process and the like. Thus, it is possible that the boron concentration at the end portion of the channel region 14 is thicker than the center portion of the channel region 14, thereby narrowing the effective gate width W. Thereby, it is possible that noise characteristics degrade.

However, in the amplification transistor Tr3 that employs the present technology, the channel region 30 is configured with the first impurity diffusion region 30a and the second impurity diffusion region 30b, and as described later the regions of high impurity concentration can be dispersed by providing the concentration difference between these two regions so as to improve the current density, and the substantial gate width W can be widened to prevent the noise characteristics from degrading. The configuration of such an amplification transistor Tr3 will be described further.

As illustrated in FIG. 6A, the amplification transistor Tr3 that employs the present technology includes a source region 25a and a drain region 25b including n-type impurity which are formed on the surface side, a channel region 30 provided between the source region 25a and the drain region 25b, and a gate electrode 22 formed between the source region 25a and the drain region 25b above the semiconductor substrate with a gate oxide film 26 in between.

Also, as illustrated in FIG. 5 and FIG. 6B, the channel region 30 below the gate electrode 22 includes the first impurity diffusion region 30a including the p-type impurity which is formed directly below the gate electrode 22, and the strip-shaped second impurity diffusion region 30b including p-type impurity which extends in the gate length L direction of the transistor at the center portion of the first impurity diffusion region 30a.

The second impurity diffusion region 30b can be formed by ion implantation with a resist mask opened in a strip shape in the gate length W direction of the transistor as described later. Also, for example, boron, phosphorus, arsenic, antimony, indium, germanium, and like can be used as the impurity included in the first impurity diffusion region 30a and the second impurity diffusion region 30b.

Figure 7A:
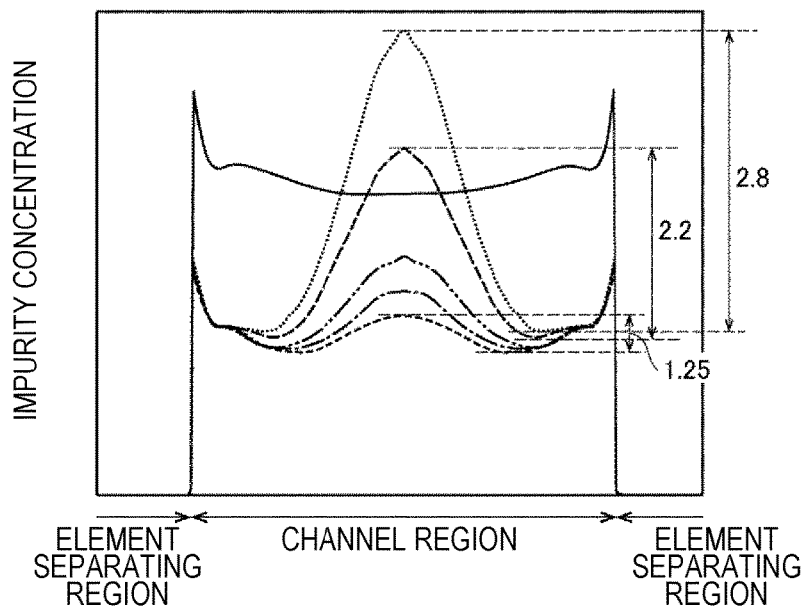
FIGS. 7A and 7B are diagrams representing impurity concentration distribution and current density distribution.
Figure 7B:
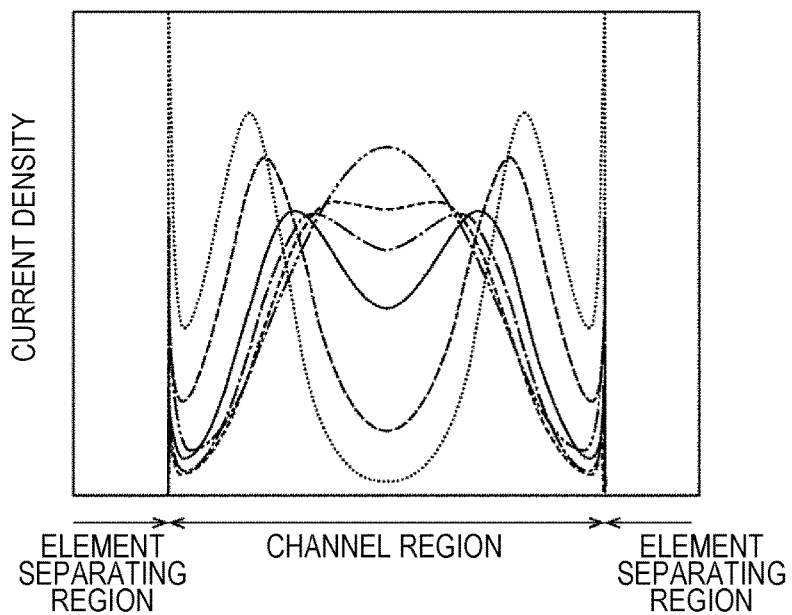

The impurity concentration distribution and the current density distribution in the channel region 30 when the amplification transistor Tr3 is configured as illustrated in FIGS. 5, 6A, and 6B are illustrated in FIGS. 7A and 7B. The graph illustrated in FIG. 7A is a graph representing the impurity concentration in the cross-sectional direction along the B-B line of FIG. 5 (the cross section illustrated in FIG. 6B). FIG. 7B is a graph representing the current density distribution in the cross-sectional direction along the B-B line of FIG. 5 (the cross section illustrated in FIG. 6B).

The graphs 1 to 6 illustrated in FIGS. 7A and 7B illustrate graphs of concentration difference of 1 to 2.8 times, respectively. Here, the concentration difference is the difference (rate) between the impurity concentration of the first impurity diffusion region 30a and the impurity concentration of the second impurity diffusion region 30b. In other words, the concentration difference indicates the impurity concentration of the second impurity diffusion region 30b, with reference to the impurity concentration of the first impurity diffusion region 30a.

As illustrated in FIG. 7A, the impurity concentration of the center part region in the channel region 30 is higher than the impurity concentrations of other regions. The center part region in the channel region 30 corresponds to the second impurity diffusion region 30b, and the other regions in the channel region 30 correspond to the first impurity diffusion region 30a.

The impurity concentration of the second impurity diffusion region 30b that forms the channel region 30 of the amplification transistor Tr3 is higher than the impurity concentrations of the first impurity diffusion region 30a.

The concentration difference in FIGS. 7A and 7B is the concentration of the second impurity diffusion region 30b expressed with reference to the concentration of the first impurity diffusion region 30a. That is, the concentration difference is a value obtained by dividing the concentration of the second impurity diffusion region 30b by the concentration of the first impurity diffusion region 30a.

The concentration of the second impurity diffusion region 30b/the concentration of the first impurity diffusion region 30a.

In the graphs illustrated in FIGS. 7A and 7B, the graph 1 is the graph of concentration difference of 1 time, and the graph 2 is the graph of concentration difference of 1.25 times, and the graph 3 is the graph of concentration difference of 1.30 times, and the graph 4 is the graph of concentration difference of 1.63 times, and the graph 5 is the graph of concentration difference of 2.2 times, and the graph 6 is the graph of concentration difference of 2.8 times.

Note that the graph 1 of the concentration difference of 1 time is the impurity concentration and the current density distribution in the amplification transistor Tr3 of the past illustrated for the purpose of comparison, for example the amplification transistor Tr3 illustrated in FIGS. 4A and 4B.

Referring to the graphs 2 to 6 illustrated in FIG. 7A, the impurity concentration is highest in the region of the second impurity diffusion region 30b located at the center part of the channel region 30, and the concentration gradually becomes smaller from its peak value. Ideally (theoretically), the impurity concentration distribution maintains the peak value (concentration b) in the second impurity diffusion region 30b, and has a predetermined constant concentration (concentration a) in the first impurity diffusion region 30a, as illustrated in FIG. 8A.

Figure 8A:
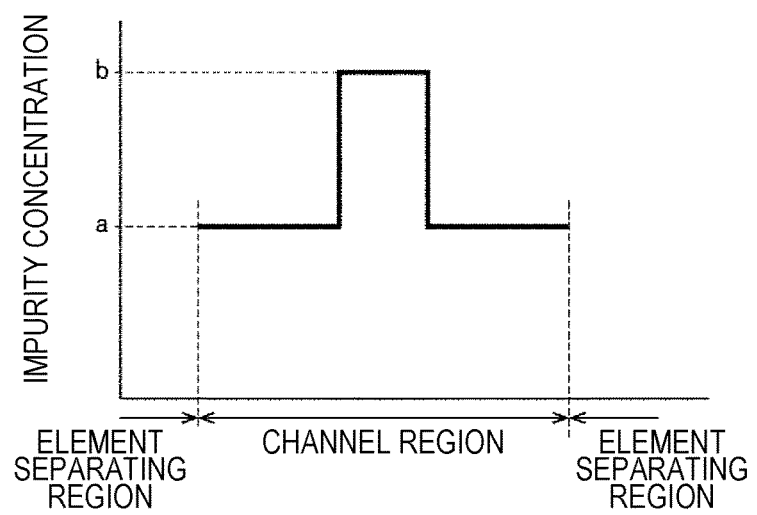
FIGS. 8A and 8B are diagrams representing impurity concentration distribution and current density distribution.

As illustrated in FIG. 8A, the first impurity diffusion region 30a and the second impurity diffusion region 30b may be the regions formed with predetermined constant concentrations (the concentration a, the concentration b) respectively. Also, as illustrated in FIG. 7A, the second impurity diffusion region 30b has the thickest concentration, and the concentration gradually decreases from its peak value, and the first impurity diffusion region 30a has a substantially constant concentration.

Although the concentration difference is a value obtained by dividing the concentration of the second impurity diffusion region 30b by the concentration of the first impurity diffusion region 30a as described above, the concentration difference may be a value obtained by dividing the concentration b by the concentration a, in the case where the first impurity diffusion region 30a and the second impurity diffusion region 30b are formed so as to obtain the graph illustrated in FIG. 8A.

In the case where the first impurity diffusion region 30a and the second impurity diffusion region 30b are formed to obtain the graph illustrated in FIG. 7A, the concentration of the first impurity diffusion region 30a is not constant, and thus the concentration of the first impurity diffusion region 30a for calculating the concentration difference is set to the lowest concentration value. That is, the value of the lowest concentration in the first impurity diffusion region 30a and the value of the highest concentration in the second impurity diffusion region 30b are used as the values for calculating the concentration difference.

In FIG. 7A, vertically directed arrows indicate that the concentration differences are 1.25 times, 2.2 times, and 2.8 times. The lower sides of these arrows indicate the lowest concentrations in the first impurity diffusion region 30a, and the upper sides of the arrows indicate the highest concentrations in the second impurity diffusion region 30b.

FIG. 7B illustrates the current density distribution of the channel region 30 in which the first impurity diffusion region 30a and the second impurity diffusion region 30b of different impurity concentrations are formed as described above. FIG. 7B is the current density distribution obtained when the impurity concentration distribution illustrated in FIG. 7A is obtained. For reference, FIG. 8B illustrates an example of current density distribution obtained when the impurity concentration distribution illustrated in FIG. 8A is obtained.

Figure 8B:
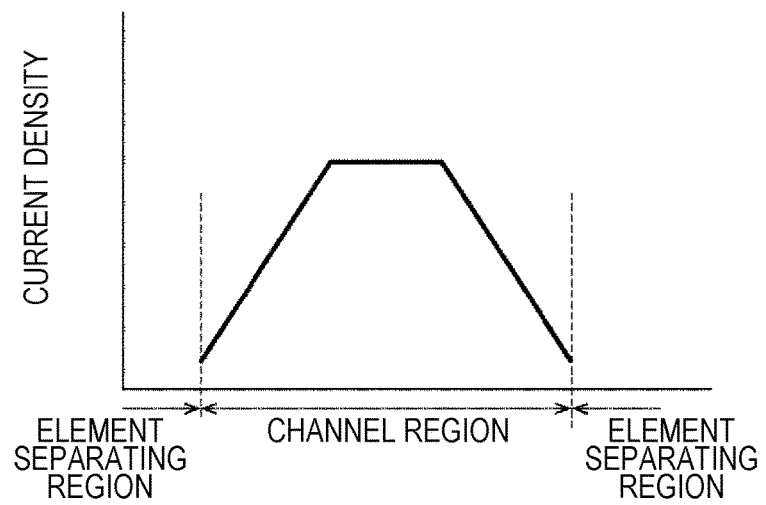

As illustrated in FIG. 8B, in the case where the impurity concentration of the first impurity diffusion region 30a and the impurity concentration of the second impurity diffusion region 30b are substantially constant at respective predetermined concentrations, the current density distribution maintains high current density in the region of the second impurity diffusion region 30b, and the current density gradually decreases as getting closer to the element separating regions 24 in the region of the first impurity diffusion region 30a.

Noise can be reduced, by the current density peak part expanding in the gate width W direction of the channel region 30, in other words, the current density dispersed at the center part of the channel region 30. Referring to FIG. 7B, it is known that the graph 1 (the amplification transistor Tr3 of the past) has a peak value at the center part, but the value gradually becomes smaller as getting closer to the element separating regions 24, and the current density of the center part of the channel region 30 is not dispersed.

In contrast, it is known that the graphs 2 to 6 have peak values at positions that are shifted from the center part, and have peak values in two regions. That is, it is known that the current density of the center part of the channel region 30 is dispersed by providing the first impurity diffusion region 30a and the second impurity diffusion region 30b, as illustrated in the graphs 2 to 6. Thus, a configuration capable of reducing the noise is created by providing the first impurity diffusion region 30a and the second impurity diffusion region 30b.

Referring to FIG. 7B, it is known that the peak value of the current density and the position of the peak value in the channel region 30 differ depending on concentration difference. For example, when comparing the graph 2 of the concentration difference of 1.25 times and the graph 6 of the concentration difference of 2.8 times, the concentration difference of 2.8 times has a higher peak value of the current density than the concentration difference of 1.25 times. However, it is known that the concentration difference of 2.8 times also has a higher current density near the element separating regions 24 than the concentration difference of 1.25 times.

On the element separating region 24 side of the channel region 30, the interface level tends to deteriorate due to the influence of dry etching and the like for forming the element separating regions 24, and it is possible that, as the current density of the element separating region 24 side of the channel region 30 becomes higher, noise characteristics degrade due to the interface level. Thus, in order to reduce the noise, it is preferable that the current density is not high near the element separating regions 24 of the channel region 30.

From the above, the concentration difference is preferably set such that the current density distribution disperses at the center part, and the peak value is high, and the current density near the element separating regions 24 of the channel region 30 is not high. For example, although FIG. 7B only illustrates the concentration difference up to 2.8 times, it is estimated that the current density becomes higher near the element separating regions 24 of the channel region 30 if the concentration difference is increased further. Thus, it is not necessarily preferable to increase the concentration difference, but the concentration difference is preferably 2.8 times or less in this case.

When the impurity concentration distribution and the current density distribution illustrated in FIGS. 7A and 7B are obtained, the first impurity diffusion region 30a and the second impurity diffusion region 30b can be formed, under a condition that the concentration difference between the first impurity diffusion region 30a and the second impurity diffusion region 30b is 1.25 times or more (larger) and 2.8 times or less (smaller).

Also, as described later, the impurity concentration of the second impurity diffusion region 30b is made higher than the impurity concentration of the first impurity diffusion region 30a, by implanting ions with a resist mask opened in a strip shape in the gate length L direction of the amplification transistor Tr3. Also, the concentration difference between the impurity concentration of the first impurity diffusion region 30a and the impurity concentration of the second impurity diffusion region 30b can be adjusted by setting a dose amount at the time of ion implantation.

<Formation Example of Second Impurity Region>

The shape of the second impurity diffusion region 30b will be described. The above second impurity diffusion region 30b has been described, taking an example in which the second impurity diffusion region 30b is formed in a strip shape that extends in the gate length L direction of the transistor, at the center part of the channel region 30 (the first impurity diffusion region 30a), like the second impurity diffusion region 30b illustrated in FIG. 5.

Figure 9:
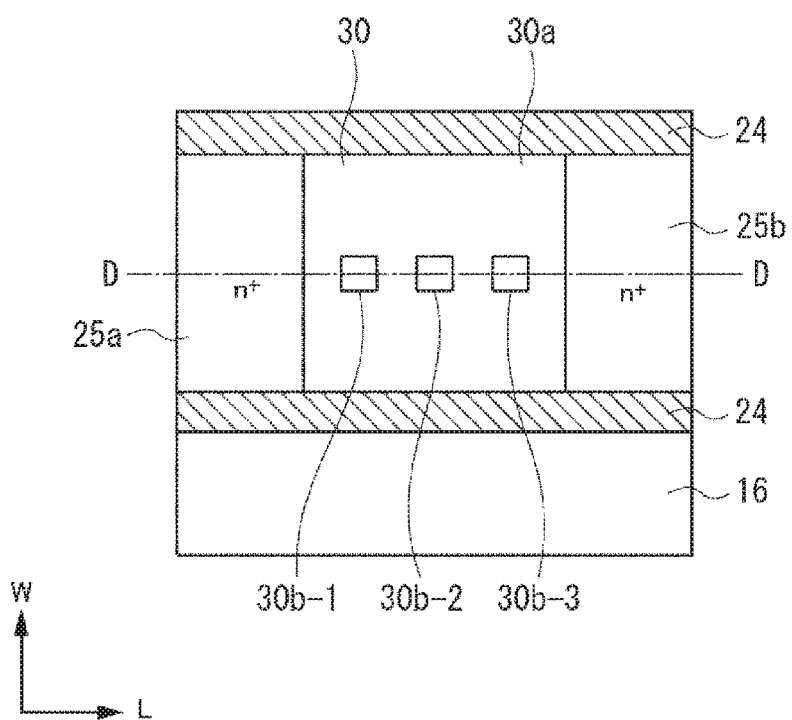
FIG. 9 is a diagram for describing a formation example of a second impurity diffusion region.

FIG. 9 illustrates another shape of the second impurity diffusion region 30b. The second impurity diffusion regions 30b illustrated in FIG. 9 are formed in plurality in a scattered manner with a predetermined shape and a predetermined size, in the gate length L direction of the transistor at the center part of the channel region 30 (the first impurity diffusion region 30a). In the configuration example illustrated in FIG. 9, a quadrangular (square) second impurity diffusion region 30b-1, a second impurity diffusion region 30b-2, and a second impurity diffusion region 30b-3 are located at the center part of the channel region 30 (the first impurity diffusion region 30a).

As described above, the second impurity diffusion regions 30b may be formed in a scattered manner at the center part of the channel region 30 (the first impurity diffusion region 30a). Although in FIG. 9 the second impurity diffusion regions 30b are quadrangular, the second impurity diffusion regions 30b may be another shape other than quadrangle, such as rhombus, polygon, and circle. This shape of the second impurity diffusion region 30b can set by the shape of a mask at the time of production.

Figure 10:
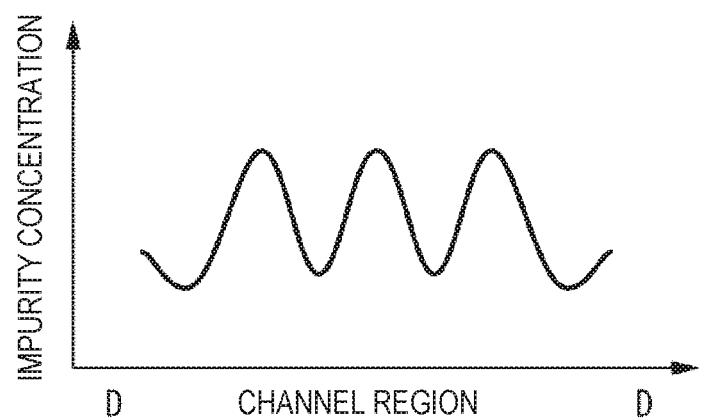
FIG. 10 is a diagram representing impurity concentration distribution.

In the case where the second impurity diffusion regions 30b are formed as illustrated in FIG. 9, the distribution of the impurity concentration in the channel region 30 is as illustrated in FIG. 10. The graph illustrated in FIG. 10 is a graph representing the impurity concentration in the cross-sectional direction along the D-D line of FIG. 9. In the case where the second impurity diffusion regions 30b illustrated in FIG. 10 are formed in three quadrangles in a dispersed manner, concentration distribution including the impurity concentration being thicker in each region of the second impurity diffusion regions 30b is obtained.

The current density of the high concentration part (its peripheral part) can be improved by dispersing the high-concentration impurity parts as described above, and the current density of the center part of the channel region 30 can be dispersed. Thus, noise can reduced, in the case where the second impurity diffusion regions 30b are formed as illustrated in FIG. 9.

As illustrated in FIG. 5, the second impurity diffusion region 30b may be provided in a strip shape at the center part of the channel region 30, and as illustrated in FIG. 9, the second impurity diffusion regions 30b may be provided in a scattered manner in a predetermined shape at the center part of the channel region 30. Further, as illustrated in FIG. 11, the second impurity diffusion region 30b may be provided in a predetermined shape at one point at the center part of the channel region 30.

Figure 11:
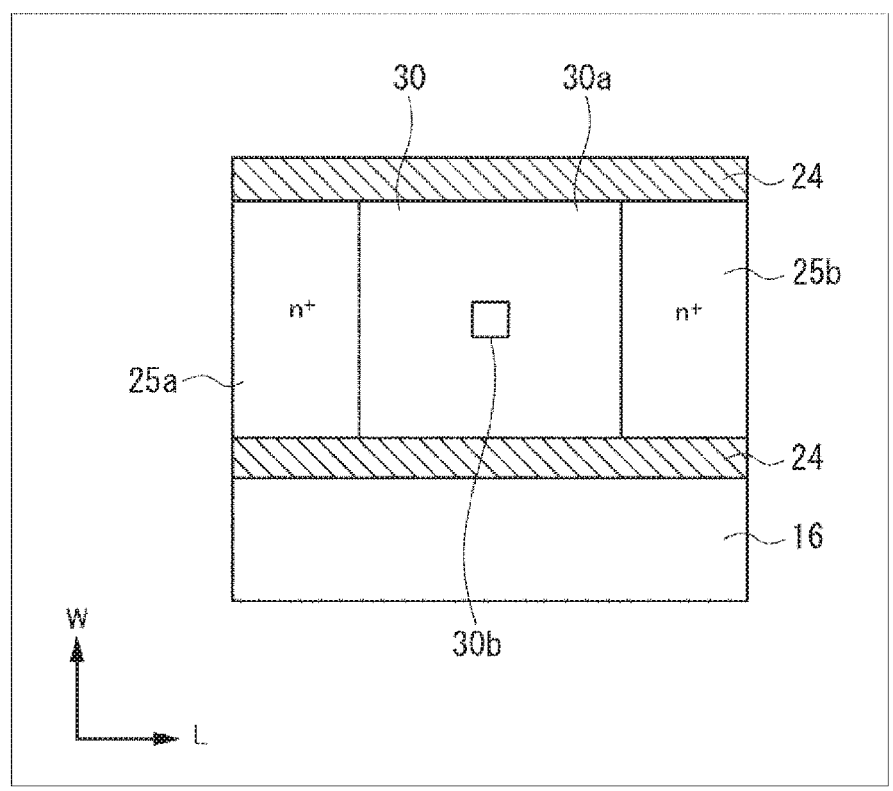
FIG. 11 is a diagram for describing a formation example of a second impurity diffusion region.

The second impurity diffusion region 30b illustrated in FIG. 11 is formed in a predetermined shape, in a square in FIG. 11, at the center part of the channel region 30. As described above, the second impurity diffusion region 30b of high impurity concentration may be provided only at the center part of the channel region 30.

When the size of the imaging device 1 (FIG. 1) is reduced, it is necessary to reduce the size of one pixel configuration. In the case where the size of the pixel is reduced, it is possible that the gate width W and the gate length L of the amplification transistor Tr3 become smaller, and the channel region 30 becomes smaller. In the case where the channel region 30 is small, or the like, the second impurity diffusion region 30b is provided only at the center part as illustrated in FIG. 11, and in the case where the channel region 30 is comparatively large, or the like, the second impurity diffusion region 30b is provided in a shape illustrated in FIG. 5 and FIG. 9.

Even in the case where the second impurity diffusion region 30b is provided only at the center part of the channel region 30 as illustrated in FIG. 11, the current density of the high-concentration impurity part (or its nearby part) can be improved, and the current density of the center part of the channel region 30 can be dispersed. Thus, even in the case where the second impurity diffusion region 30b illustrated in FIG. 11 is provided, the noise can be reduced.

The second impurity diffusion regions 30b illustrated in FIG. 5, FIG. 9, and FIG. 11 have been described taking an example in which the second impurity diffusion region 30b is provided in the gate length L direction, but the second impurity diffusion region 30b can be provided in the gate width W direction.

Figure 12:
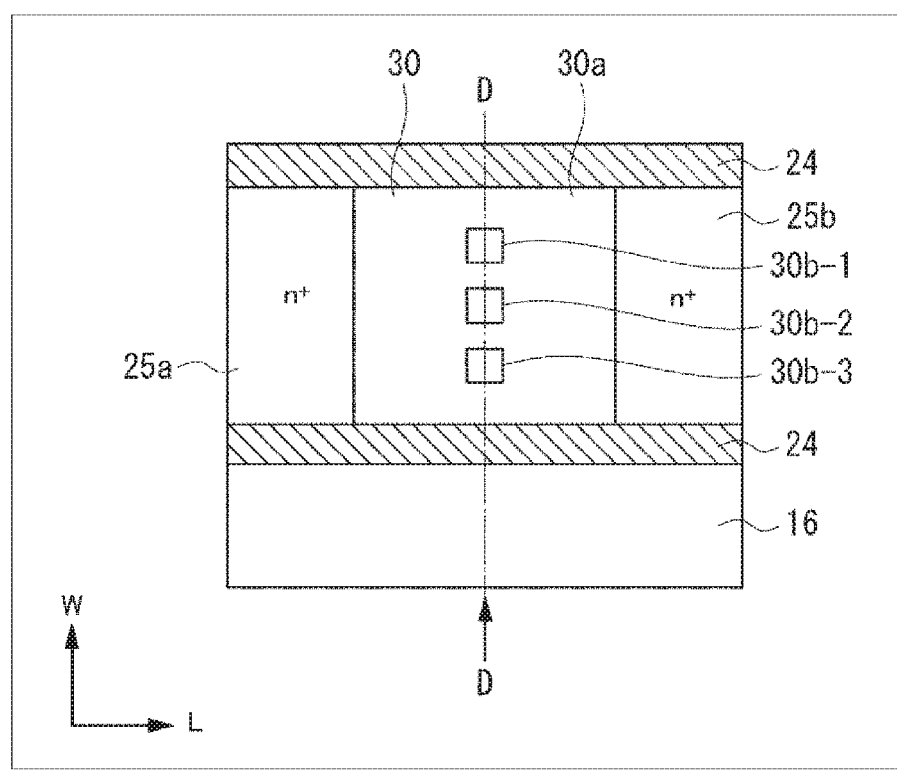
FIG. 12 is a diagram for describing a formation example of a second impurity diffusion region.

FIG. 12 illustrates an example in which the second impurity diffusion regions 30b are provided in the gate width W direction. The second impurity diffusion regions 30b illustrated in FIG. 12 are formed in a scattered manner with a predetermined size in a predetermined shape (quadrangle) at the center part of the channel region 30 likewise the second impurity diffusion regions 30b illustrated in FIG. 9, but differ in that the direction formed is the gate width W direction.

FIG. 12 illustrates a case in which the second impurity diffusion regions 30b are formed in a scattered manner with a predetermined size in a predetermined shape (quadrangle) at the center part of the channel region 30 likewise the second impurity diffusion regions 30b illustrated in FIG. 9, but the second impurity diffusion regions 30b may be formed in a strip shape at the center part of the channel region 30 likewise the second impurity diffusion region 30b illustrated in FIG. 5.

Also, the second impurity diffusion regions 30b may be formed in both of the gate width W direction and the gate length L direction, by combining the second impurity diffusion regions 30b illustrated in both of FIG. 9 and FIG. 12.

In the case where the second impurity diffusion regions 30b are formed in the gate width W direction, the high-concentration impurity parts can be dispersed in the same way as the case in which the second impurity diffusion regions 30b are formed in the gate length L direction, and the current density of the high-concentration parts (or its nearby part) can be improved. Thus, the current density of the center part of the channel region 30 can be dispersed. From this, the noise can be reduced, in the case where the second impurity diffusion regions 30b are provided as illustrated in FIG. 12.

<Regarding Production Method>

A production of the amplification transistor Tr3 including the first impurity diffusion region 30a and the second impurity diffusion region 30b of different impurity concentrations in the channel region 30 as described above, particularly a formation method of the first impurity diffusion region 30a and the second impurity diffusion region 30b, will be described below.

FIGS. 13A, 13B, 13C, 14D, and 14E are diagrams for describing the production of the amplification transistor Tr3. Here, an example will be described in which the second impurity diffusion region 30b illustrated in FIGS. 5, 6A, and 6B is formed in a strip shape at the center part of the channel region 30.

Figure 13A:
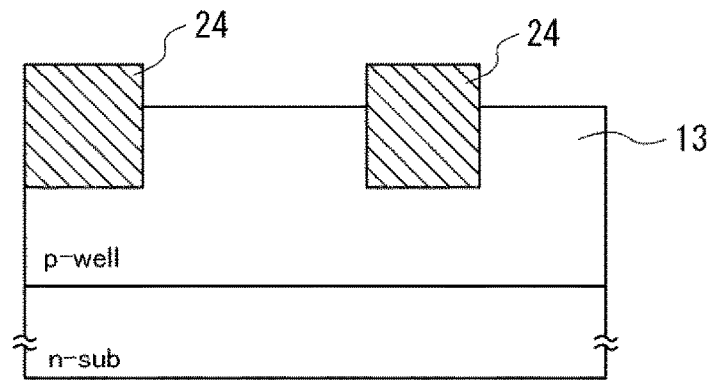
FIGS. 13A, 13B, and 13C are diagrams for describing a production process of an amplification transistor.

As illustrated in FIG. 13A, trench sections formed with an intended depth from the substrate surface, and element separating regions 24 made of insulation material buried in the trench sections, are formed on the semiconductor substrate.

For example, an n-type semiconductor substrate is prepared, and a resist layer is formed on the semiconductor substrate, and light exposure and image development are performed by using a photolithography technology, and thereby a resist mask pattern having open regions for forming the element separating regions 24 is formed. Then, the semiconductor substrate is etched to perform etching removal to the intended depth from the surface side of the semiconductor substrate, and thereby the trench sections are formed.

The insulation material for forming the element separating regions 24 is filled in the trench sections by using a chemical vapor deposition (CVD) method for example, and thereby the element separating regions 24 are formed on the semiconductor substrate.

Figure 13B:
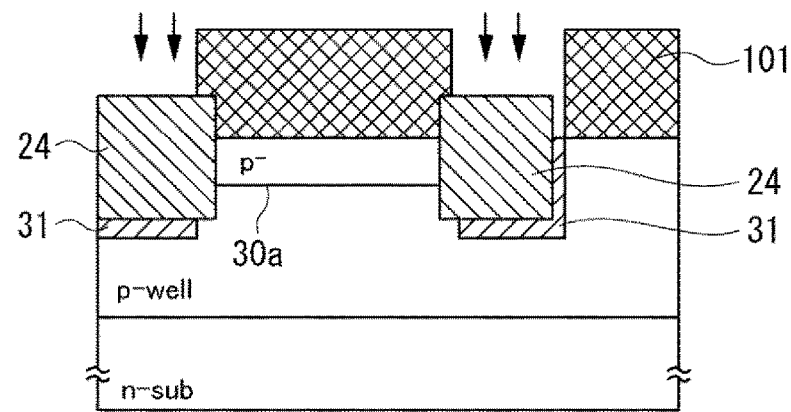

As illustrated in FIG. 13B, a resist mask 101 is formed by performing light exposure and image development by using the photolithography technology, and impurity diffusion regions 31 including p-type impurity for reducing the dark current generated from the element separating region 24 side are formed via the resist mask 101.

Figure 13C:
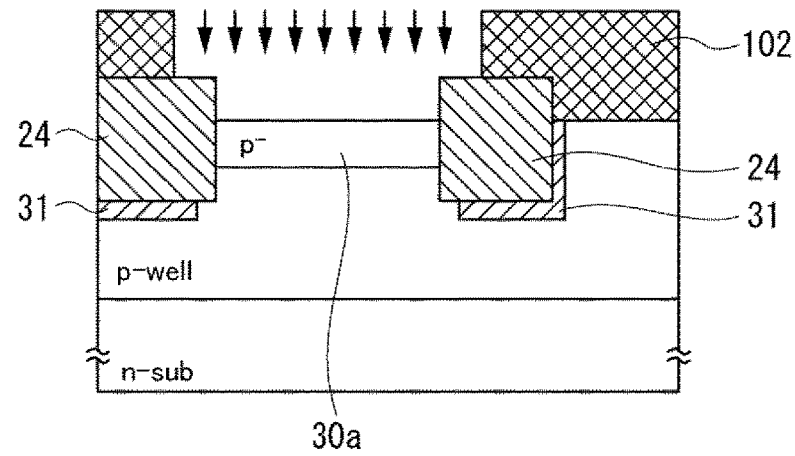

As illustrated in FIG. 13C, a resist mask 102 is formed by performing light exposure and image development by using the photolithography technology, and a first impurity diffusion region 30a including p-type impurity is formed in the channel region 30 of the amplification transistor Tr3, via the resist mask 102.

For example, the resist mask 102 that opens the channel region 30 of the amplification transistor Tr3 is formed, and the p-type impurity ions are implanted via the resist mask 102, and thereby the first impurity diffusion region 30a is formed.

Figure 14D:
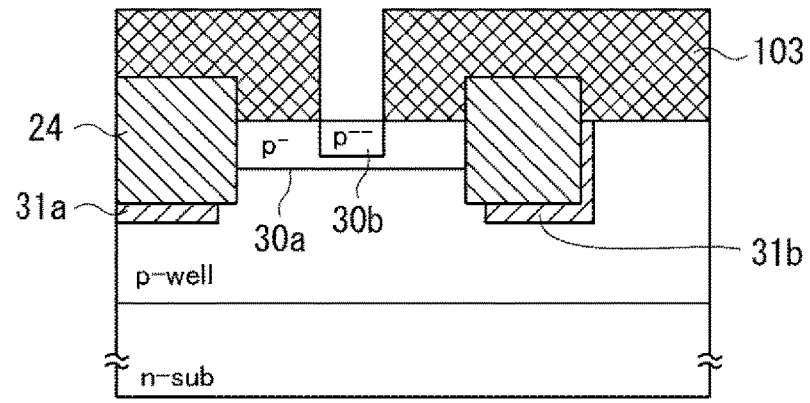
FIGS. 14D and 14E are diagrams for describing a production process of an amplification transistor.

As illustrated in FIG. 14D, a strip-shaped resist mask 103 that extends in the gate length L direction of the amplification transistor Tr3 is formed at the center part of the first impurity diffusion region 30a, and the second impurity diffusion region 30b including p-type impurity is formed via the resist mask 103.

For example, in the same way as forming the first impurity diffusion region 30a, the resist mask 103 that opens the second impurity diffusion region 30b of the channel region 30 of the amplification transistor Tr3 is formed, and p-type impurity ions are implanted via the resist mask 103, and thereby the second impurity diffusion region 30b is formed.

When the second impurity diffusion region 30b is formed, the impurity is doped in such a manner that the impurity concentration of the second impurity diffusion region is equal to or larger than 1.25 times and smaller than 2.8 times the impurity concentration of the first impurity diffusion region, with reference to the impurity concentration of the first impurity diffusion region, for example.

As described above, the second impurity diffusion region 30b is formed after the first impurity diffusion region 30a is formed, and thus the impurity concentration can be set high at the center part of the channel region 30. That is, two regions of different impurity concentrations can be formed by performing ion implantation twice. Also, the concentration difference between the impurity concentration of the first impurity diffusion region 30a and the impurity concentration of the second impurity diffusion region 30b can be adjusted by setting the dose amount at the time of ion implantation.

Also, the impurity whose ion is implanted to form the first impurity diffusion region 30a and the second impurity diffusion region 30b is, for example, boron, phosphorus, arsenic, antimony, indium, germanium, and the like.

Also, here, the description has been made assuming that the ion implantation is performed to form the impurity diffusion region, but the impurity may be doped into the semiconductor substrate, and the impurity diffusion region may be formed, by a method other than the ion implantation.

By the above process, the amplification transistor Tr3 including the first impurity diffusion region 30a and the second impurity diffusion region 30b is produced as illustrated in FIG. 10E.

Although the description is omitted in FIGS. 13A, 13B, 13C, 14D and 14E, the p-type well region 13 is formed by implanting ions of p-type impurity, for example B (boron), to the surface side of the semiconductor substrate in a predetermined process. The well region 13 is formed in a deeper direction than the region in which the photo diode PD and the pixel transistors Tr1 to Tr4 (FIG. 2, FIG. 3) are formed.

Also, a process for forming the photo diode PD is included. For example, the resist mask 103 is removed after the process illustrated in FIG. 14D, and a resist mask (not illustrated in the drawings) that opens the region for forming the photo diode PD is formed.

Then, n-type impurity ions are implanted to an intended depth via the resist mask, and thereby an n-type semiconductor region forming an electric charge accumulation layer 15 of the photo diode PD is formed. Thereafter, a P-type semiconductor region forming a dark current reduction region 16 is formed by implanting p-type impurity ions at a high concentration to the outermost surface of the semiconductor substrate via the resist mask. In this way, the process for forming the photo diode PD is also included.

In such a production process, the second impurity diffusion region 30b is formed, after the first impurity diffusion region 30a is formed, as described above. In other words, the first impurity diffusion region 30a and the second impurity diffusion region 30b are formed, by performing ion implantation twice.

Figure 15:
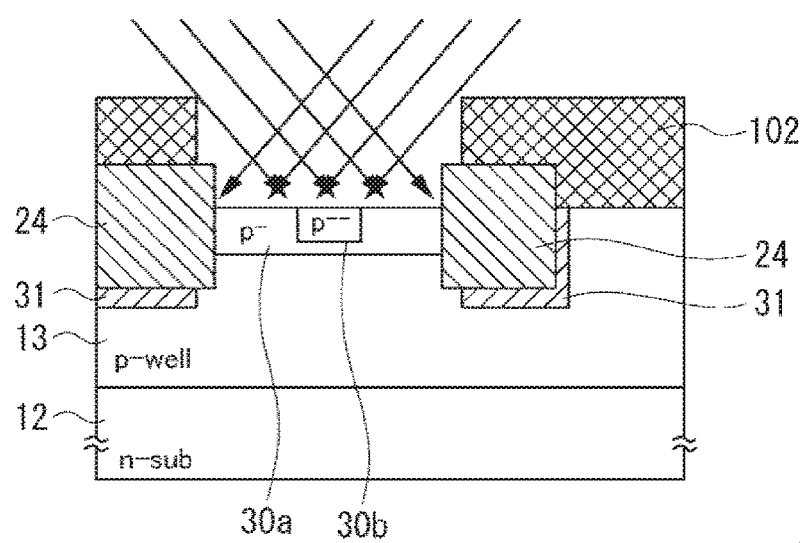
FIG. 15 is a diagram for describing a production process of an amplification transistor.
Figure 16:
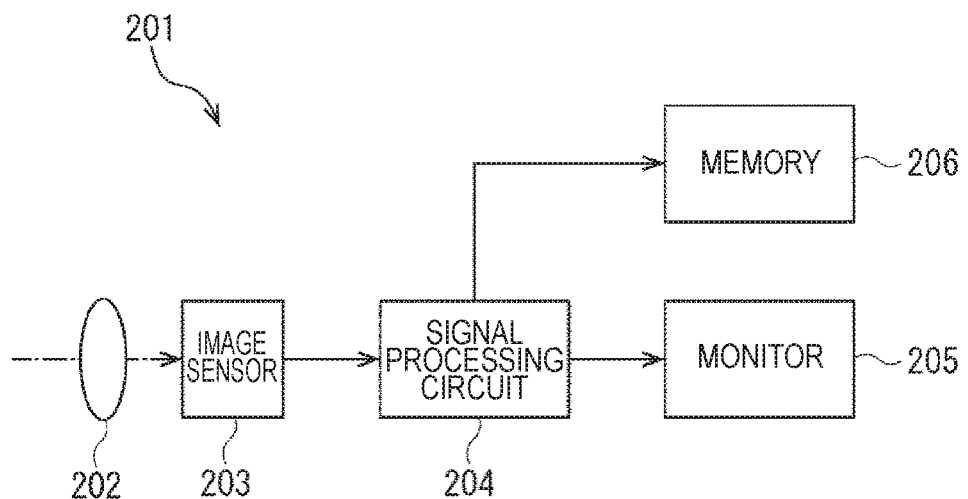
FIG. 16 is a diagram for describing an application example to an electronic device.

In the process, the first impurity diffusion region 30a and the second impurity diffusion region 30b may be formed by performing ion implantation once, by performing ion implantation as illustrated in FIG. 15.

The process illustrated in FIG. 15 can be an alternative process of the process illustrated in FIG. 13C and FIG. 14D. In the process illustrated in FIG. 15, the resist mask 102 that opens the channel region 30 of the amplification transistor Tr3 is formed, and p-type impurity ions are implanted from oblique directions via the resist mask 102, and thereby the first impurity diffusion region 30a and the second impurity diffusion region 30b are formed.

Moregions can be implanted at the center part of the channel region 30, than at the end portion side of the channel region 30, by implanting the ions from the oblique directions. Thereby, the second impurity diffusion region 30b is formed at the center part of the channel region 30, and the first impurity diffusion region 30a is formed in a region other than the center part of the channel region 30.

As described above, the first impurity diffusion region 30a and the second impurity diffusion region 30b may be formed at the same timing, by implanting the ions from the oblique directions.

As above, in the present embodiment, the amplification transistor Tr3 that configures the pixel 2 is the buried-channel MOS transistor, and the channel region 30 is configured with the first impurity diffusion region 30a and the second impurity diffusion region 30b, and thereby the channel region 14 is expanded practically without changing the size of the gate electrode 22, and the reduction of the noise is achieved.

Although the above embodiment has been described taking an example in which two regions including the first impurity diffusion region 30a and the second impurity diffusion region 30b are provided, a plurality of regions, not two regions but three regions for example, of different concentrations may be provided in the channel region 30.

The present embodiment has been described with an example in which the amplification transistor Tr3 is the p-channel MOS transistor, but the amplification transistor Tr3 may be an n-channel MOS transistor in the example. In the case of the n-channel MOS transistor, the configuration may be such that the first conductivity type is n-type and the second conductivity type is p-type in the above description.

Also, in the present embodiment, the buried-channel MOS transistor is employed as the amplification transistor Tr3, but may be employed as other pixel transistors, for example the reset transistor Tr2 and the selection transistor Tr4, in an example. Also, in the example, the pixel is configured with four pixel transistors including the selection transistor Tr4, but can be configured with three pixel transistors excluding the selection transistor Tr4.

In the case where the pixel is configured with the four pixel transistors including the selection transistor Tr4, the selection transistor Tr4 serves the role of a switch, and thus the amplification transistor Tr3 may be a normally-on (depletion) FET and may be a normally-off type. Moreover, in the present embodiment, the transfer transistor Tr1, the reset transistor Tr2, and the selection transistor Tr4 are also configured with the buried-channel MOS transistors, for example. However, the configuration may be such that only the amplification transistor Tr3 is configured with the buried-channel MOS transistor, and the other pixel transistors are configured with the surface-channel pixel transistors.

The present disclosure is not limited to application to the imaging device that captures an image by detecting the distribution of the incoming light amount of visible light, but is also applicable to an imaging device that captures an image of the distribution of the incoming amount of infrared light, X-ray, particles, or the like. Also, in a broad sense, the present disclosure is applicable to a general solid state imaging device (physical quantity distribution detection device) such as a fingerprint detection sensor that captures an image by detecting the distribution of other physical quantities, such as pressure, electrostatic capacitance, or the like.

Further, the present disclosure is not limited to the imaging device that reads out the pixel signal from each unit pixel by scanning each unit pixel of the pixel unit in order row by row. The present disclosure is also applicable to an X-Y address imaging device that selects an arbitrary pixel pixel by pixel and reads out a signal from the selected pixel pixel by pixel.

Note that the imaging device may be formed as one chip, and may be formed as a module having an image capturing function in which a pixel unit and a signal processing unit or an optical system are packaged together.

<Application Example to Electronic Device>

The present disclosure is not limited to the application to the imaging device, but is also applicable to a semiconductor device including a buried-channel MOS transistor, and other imaging devices. Here, the imaging device means a camera system such as a digital still camera and a digital video camera, and an electronic device having an image capturing function, such as a mobile phone. Note that, in some cases, the imaging device is the above modular form provided in the electronic device, that is, the camera module.

FIGS. 13A, 13B, and 13C are block diagrams illustrating a configuration example of the imaging device provided in the electronic device.

Figure 14E:
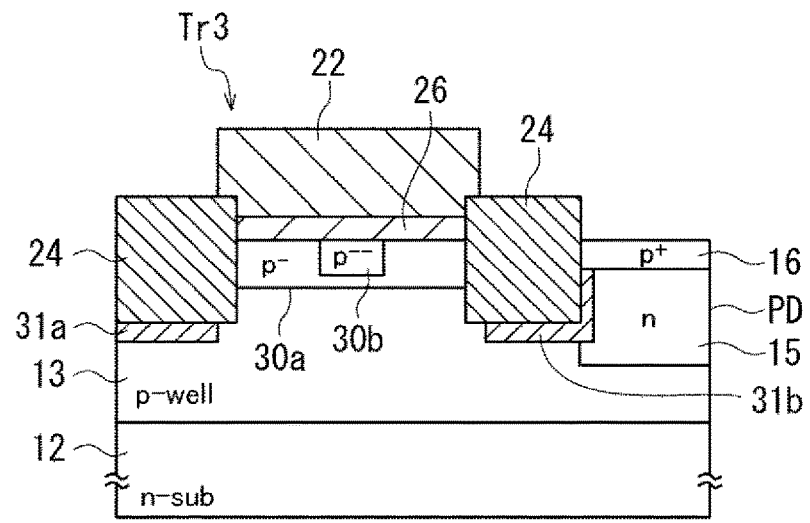

As illustrated in FIGS. 14D and 14E, an imaging device 201 includes an optical system 202, an image sensor 203, a signal processing circuit 204, a monitor 205, and a memory 206, and is capable of capturing a still image and a moving image.

The optical system 202 includes one or a plurality of lenses, and directs image light (incoming light) from an object to the image sensor 203, and forms an image on the light receiving surface (sensor unit) of the image sensor 203.

The image sensor 203 employs the imaging device 1 of each of the above embodiments. Electrons are accumulated in the image sensor 203 for a certain period, in accordance with the image formed on the light receiving surface via the optical system 202. Then, the signal according to the electrons accumulated in the image sensor 203 is supplied to the signal processing circuit 204.

The signal processing circuit 204 performs various types of signal processing to the pixel signal output from the image sensor 203. The image (image data) obtained by the signal processing circuit 204 performing the signal processing is supplied to and displayed on the monitor 205, or is supplied to and stored (recorded) in the memory 206.

In the imaging device 201 configured as described above, the image can be captured at a higher frame rate, by speeding up AD conversion processing by employing the imaging device 1 of each of the above embodiments, for example.

Usage Example

Figure 17:
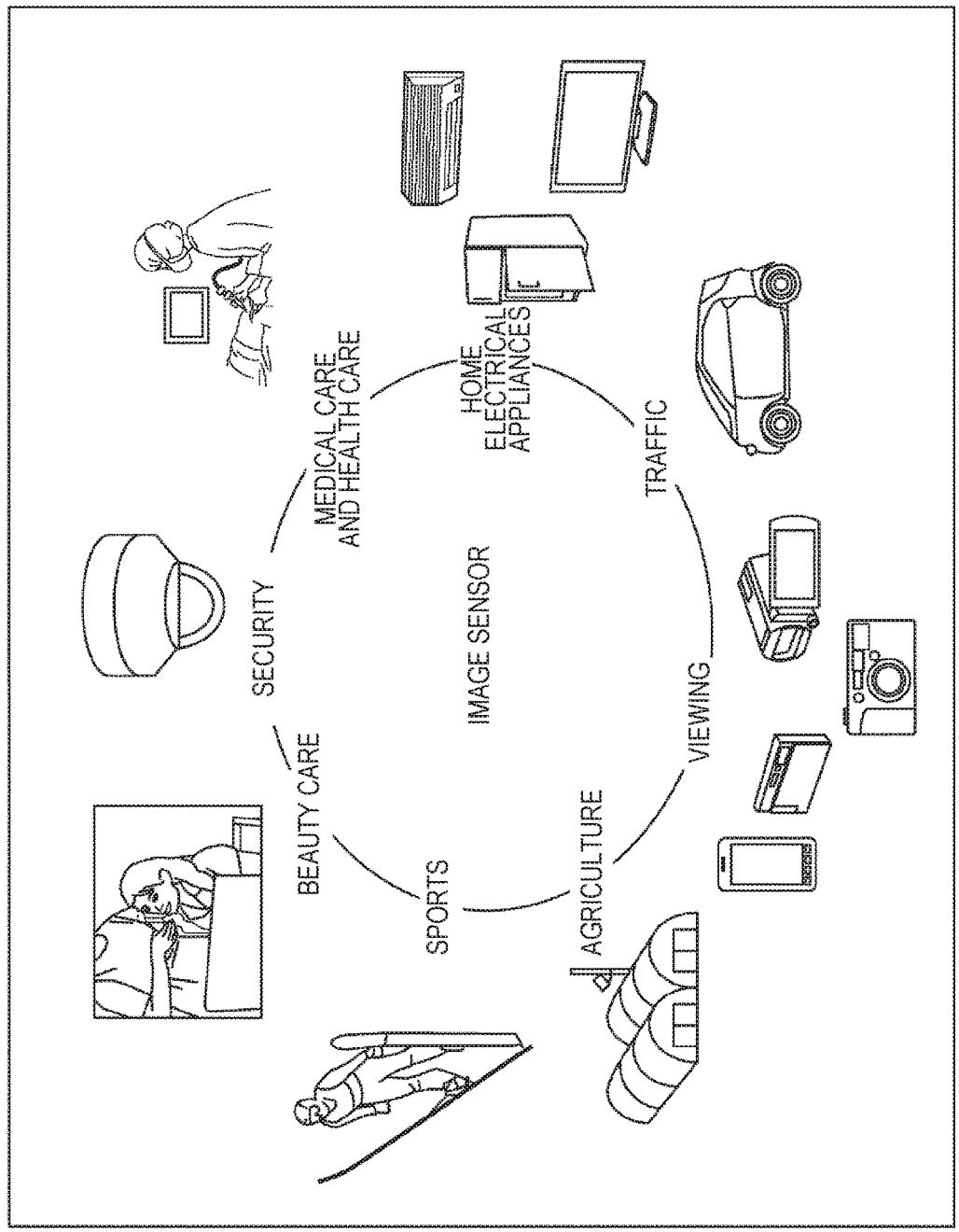
FIG. 17 is a diagram for describing a usage example of an image sensor.

FIG. 17 is a diagram illustrating a usage example of the above-described imaging device 1 (an image sensor).

The image sensor can be, for example, used in various cases in which light such as visible light, infrared light, ultraviolet light and X-ray is sensed as described below.

Devices that take images used for viewing, such as a digital camera and a portable appliance with a camera function.

Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.

Devices used for home electrical appliances, such as a TV, a refrigerator, and an air conditioner, to takes images of a gesture of a user and perform appliance operation in accordance with the gesture.

Devices used for medical care and health care, such as an endoscope and a device that performs angiography by reception of infrared light.

Devices used for security, such as a monitoring camera for crime prevention and a camera for personal authentication.

Devices used for beauty care, such as skin measurement equipment that takes images of the skin and a microscope that takes images of the scalp.

Devices used for sports, such as an action camera and a wearable camera for sports and the like.

Devices used for agriculture, such as a camera for monitoring the condition of the field and crops.

Additionally, the present technology may also be configured as below.

(1)

A semiconductor device including:

a drain region and a source region provided in a predetermined region of a semiconductor substrate;

a channel region provided between the drain region and the source region; and a gate electrode formed on the channel region, in which the channel region includes a first impurity diffusion region, and a second impurity diffusion region that is an impurity diffusion region of a same conductivity type as the first impurity diffusion region, and has an impurity concentration different from an impurity concentration of the first impurity diffusion region, and is formed at a substantially center part of the first impurity diffusion region.

(2)

The semiconductor device according to (1), in which the impurity concentration of the second impurity diffusion region is higher than the impurity concentration of the first impurity diffusion region.

(3)

The semiconductor device according to (1) or (2), in which the impurity concentration of the second impurity diffusion region is 1.25 times or more the impurity concentration of the first impurity diffusion region, with reference to the impurity concentration of the first impurity diffusion region.

(4)

The semiconductor device according to any of (1) to (3), in which the impurity concentration of the second impurity diffusion region is smaller than 2.8 times the impurity concentration of the first impurity diffusion region, with reference to the impurity concentration of the first impurity diffusion region.

(5)

The semiconductor device according to any of (1) to (4), in which the second impurity diffusion region is formed in a strip shape in a gate length direction of a center part of the first impurity diffusion region.

(6)

The semiconductor device according to any of (1) to (4), in which the second impurity diffusion region is formed in a scattered manner in a predetermined shape in a gate length direction or a gate width direction of a center part of the first impurity diffusion region.

(7)

The semiconductor device according to any of (1) to (4), in which the second impurity diffusion region is formed in a predetermined shape at a center part of the first impurity diffusion region.

(8)

A semiconductor device including:

a drain region and a source region provided in a predetermined region of a semiconductor substrate;

a channel region provided between the drain region and the source region; and a gate electrode formed on the channel region, in which the channel region is an impurity diffusion region, and the impurity is doped in such a manner that an impurity concentration is highest at a substantially center part in the channel region.

(9)

A production method for producing a semiconductor device, the semiconductor device including:

a drain region and a source region provided in a predetermined region of a semiconductor substrate;

a channel region provided between the drain region and the source region; and a gate electrode formed on the channel region, in which the channel region includes a first impurity diffusion region, and a second impurity diffusion region that is an impurity diffusion region of a same conductivity type as the first impurity diffusion region, and is formed at a substantially center part of the first impurity diffusion region.

(10)

The production method according to (9), including:

forming the first impurity diffusion region by forming a mask opened in the channel region and doping an impurity; and forming the second impurity diffusion region by forming a mask opened in a strip shape in a gate length direction of the channel region and doping an impurity.

(11)

The production method according to (9), including:

forming the first impurity diffusion region by forming a mask opened in the channel region and doping an impurity; and forming the second impurity diffusion region by forming a mask including a predetermined shape opened in a scattered manner in a gate length direction or a gate width direction of the channel region and doping an impurity.

(12)

The production method according to (9), including:

forming the first impurity diffusion region by forming a mask opened in the channel region and doping an impurity; and forming the second impurity diffusion region by forming a mask including a predetermined shape opened at a center part of the channel region and doping an impurity.

(13)

The production method according to (9), including:

forming the first impurity diffusion region and the second impurity diffusion region by forming a mask opened in the channel region and doping an impurity from an oblique direction.

(14)

The production method according to any of (9) to (13), including:

doping the impurity in such a manner that an impurity concentration of the second impurity diffusion region is 1.25 times or more an impurity concentration of the first impurity diffusion region, with reference to the impurity concentration of the first impurity diffusion region.

(15)

The production method according to any of (9) to (14), including:

doping the impurity in such a manner that an impurity concentration of the second impurity diffusion region is smaller than 2.8 times an impurity concentration of the first impurity diffusion region, with reference to the impurity concentration of the first impurity diffusion region.

REFERENCE SIGNS LIST 1 imaging device
2 pixel
3 pixel region
4 vertical drive circuit
5 column signal processing circuit
6 horizontal drive circuit
7 output circuit
8 control circuit
9 vertical signal line
10 horizontal signal line
12 semiconductor substrate
13 well region
15 electric charge accumulation layer
16 dark current reduction region
20, 21, 22, 23 gate electrode
24 element separating region
25 source-drain region
25a source region
25b drain region
26 gate insulating film
27 trench section
28 buried film
30 channel region
30a first impurity diffusion region
30b second impurity diffusion region

The invention claimed is:

1. A semiconductor device, comprising:
a drain region and a source region in a specific region of a semiconductor substrate;
a channel region between the drain region and the source region; and
a gate electrode above the channel region,
wherein the channel region includes
a first impurity diffusion region having a first impurity concentration, and
a second impurity diffusion region having a second impurity concentration, wherein
the first impurity diffusion region and the second impurity diffusion region have same conductivity type,
the second impurity concentration is different from the first impurity concentration,
the second impurity diffusion region is at a substantially center part of the first impurity diffusion region, and
the first impurity diffusion region is formed at both ends of the channel region so as to surround the second impurity diffusion region.

2. The semiconductor device according to claim 1, wherein
the second impurity concentration is higher than the first impurity concentration.

3. The semiconductor device according to claim 1, wherein
the second impurity concentration is one of greater than or equal to 1.25 times the first impurity concentration.

4. The semiconductor device according to claim 1, wherein
the second impurity concentration is one of smaller than or equal to 2.8 times the first impurity concentration.

5. The semiconductor device according to claim 1, wherein
the second impurity diffusion region having a strip shape along a gate length direction of a center part of the first impurity diffusion region.

6. The semiconductor device according to claim 1, wherein
the second impurity diffusion region is formed in a scattered manner in a specific shape in a gate length direction or a gate width direction of a center part of the first impurity diffusion region.

7. The semiconductor device according to claim 1, wherein
the second impurity diffusion region is of a specific shape at a center part of the first impurity diffusion region.

8. A semiconductor device, comprising:
a drain region and a source region in a specific region of a semiconductor substrate;
a channel region between the drain region and the source region; and
a gate electrode above the channel region, wherein
the channel region is an impurity diffusion region,
an impurity is doped in the impurity diffusion region such that an impurity concentration is highest at a center part in the channel region, and
the center part of the channel region is surrounded by remaining of the channel region having lower impurity concentration than the impurity concentration of the center part.

9. A method of manufacturing a semiconductor device, comprising:
forming a drain region and a source region in a specific region of a semiconductor substrate;
forming a channel region between the drain region and the source region; and
forming a gate electrode on the channel region,
wherein the channel region includes
a first impurity diffusion region having a first impurity concentration, and
a second impurity diffusion region having a second impurity concentration, wherein
the first impurity diffusion region and the second impurity diffusion region have same conductivity type,
the second impurity concentration is different from the first impurity concentration, and
the second impurity diffusion region is formed at a substantially center part of the first impurity diffusion region, and
the first impurity diffusion region is formed at both ends of the channel region so as to surround the second impurity diffusion region.

10. The method according to claim 9, further comprising:
forming the first impurity diffusion region by forming a first mask opened in the channel region and doping an impurity; and
forming the second impurity diffusion region by forming a second mask opened in a strip shape in a gate length direction of the channel region and doping the impurity.

11. The method according to claim 9, further comprising:
forming the first impurity diffusion region by forming a first mask opened in the channel region and doping an impurity; and
forming the second impurity diffusion region by forming a second mask including a specific shape opened in a scattered manner in a gate length direction or a gate width direction of the channel region and doping the impurity.

12. The method according to claim 9, further comprising:
forming the first impurity diffusion region by forming a first mask opened in the channel region and doping an impurity; and forming the second impurity diffusion region by forming a second mask including a specific shape opened at a center part of the channel region and doping the impurity.

13. The method according to claim 9, further comprising: forming the first impurity diffusion region and the second impurity diffusion region by forming a mask opened in the channel region and doping an impurity from an oblique direction.

14. The method according to claim 9, further comprising: doping an impurity such that an impurity concentration of the second impurity diffusion region is one of equal to or greater than 1.25 times an impurity concentration of the first impurity diffusion region.

15. The method according to claim 9, further comprising: doping an impurity such that an impurity concentration of the second impurity diffusion region is one of smaller than or equal to 2.8 times an impurity concentration of the first impurity diffusion region.

\* \* \* \* \*